United States Patent [19]

Spilsbury et al.

[11] 4,234,960
[45] Nov. 18, 1980

[54] ANTENNA AUTOMATIC TUNING APPARATUS

[75] Inventors: Ronald W. Spilsbury, Coquitlam, Canada; Ashton J. Spilsbury, 6691 Madrona Crescent, West Vancouver, British Columbia, Canada, V7W 2J9

[73] Assignee: Ashton James Spilsbury, West Vancouver, Canada

[21] Appl. No.: 921,273

[22] Filed: Jul. 3, 1978

[51] Int. Cl.³ .............................................. H04B 1/04
[52] U.S. Cl. .................................... 455/123; 455/125; 455/115; 334/20
[58] Field of Search ............... 325/171, 172, 173, 174, 325/177, 127, 128, 134, 133, 420, 455, 381, 383, 385, 468, 490, 368, 369; 333/8, 17 M, 32; 334/20, 21, 22, 26, 27

[56] References Cited

U.S. PATENT DOCUMENTS

| | | | |
|---|---|---|---|
| 2,901,614 | 8/1959 | Sherwood | 334/26 |
| 3,454,881 | 7/1969 | Fletcher | 325/177 |
| 3,475,703 | 10/1969 | Kennedy et al. | 333/17 M |
| 3,537,010 | 10/1970 | Roza | 325/381 |
| 3,590,385 | 6/1971 | Sabo | 325/177 |
| 4,112,395 | 9/1978 | Seward | 333/32 |

Primary Examiner—Robert L. Griffin
Assistant Examiner—Tommy P. Chin
Attorney, Agent, or Firm—Christie, Parker & Hale

[57] ABSTRACT

Apparatus for automatically tuning a circuit to a radio frequency signal. The apparatus has a signal supply for supplying the radio frequency signal to the circuit. A frequency counter and variable impedance are also connected in the circuit. A motor changes the setting of the variable impedance to vary its impedance. The frequency counter is connected to the signal supply means and produces a digital signal representative of the frequency of the radio frequency signal for controlling operation of the motor. The impedance of the circuit is thus varied in relation to the frequency of the radio frequency signal to provide coarse tuning of the circuit.

3 Claims, 3 Drawing Figures

ANTENNA AUTOMATIC TUNING APPARATUS

In accordance with this invention there is provided apparatus for automatically tuning a circuit to a radio frequency signal comprising: signal supply means for supplying said radio frequency signal to said circuit, a frequency counter, variable impedance means connected in said circuit, a motor for varying the impedance of said variable impedance means, said frequency counter being connected to said signal supply means and adapted to produce a digital signal representative of the frequency of said radio frequency signal for controlling operation of said motor, whereby the impedance of said circuit is varied in relation to the frequency of said radio frequency to provide sufficient coarse tuning of said circuit. In order that a phase detector means adapted to establish further control of said motor can accomplish ultimate precise tuning of said circuit.

In drawings which illustrate embodiments of the invention,

Figure 1:
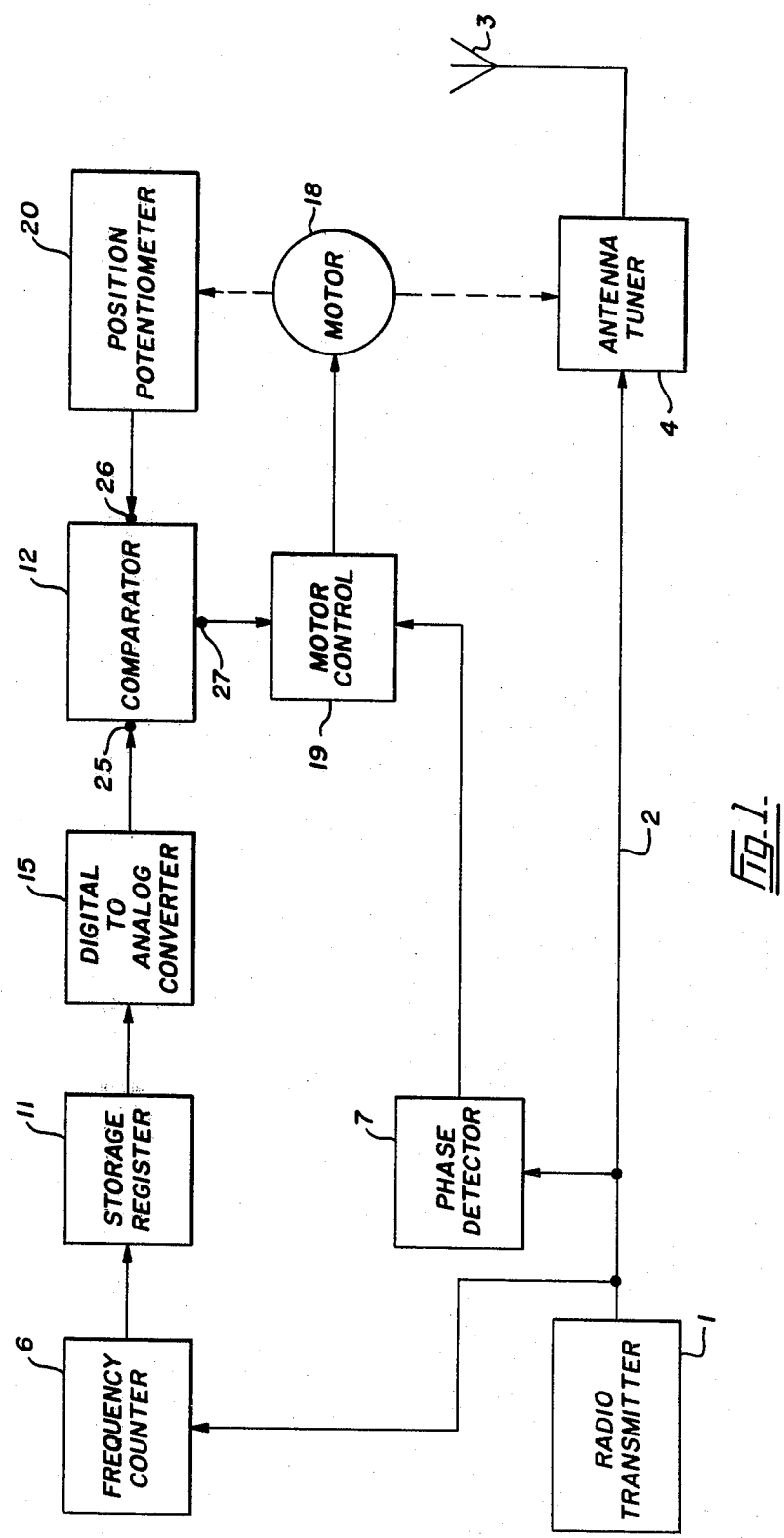
FIG. 1 is a block diagram illustrating apparatus for providing automatic tuning of an antenna circuit to a radio transmitter, in accordance with this invention.

Referring to FIG. 1, there is shown a radio transmitter 1 which is adapted to produce in line 2 radio frequency output signals of varying frequencies. Phase detector 7 is coupled to the output terminals of transmitter 1 by radio frequency transmission line 2 and is thereby adapted to receive the output signals for the transmitter 1.

The output terminals of radio transmitter 1 are also coupled via radio frequency line 2 to antenna tuner 4 for the antenna 3, said antenna tuner having a variable reactance (either inductive, capacitive or a combination of both). Antenna tuner 4 includes a loading coil (not illustrated) and a tuning core (not illustrated). The tuning core is adapted to be moved within the loading coil as to provide variation of its degree of insertion within the coil and hence variation of the impedance of the loading coil. The positioning of the tuning core within the loading coil is controlled by motor 18.

Position potentiometer 20 includes a rotor (not illustrated) which is physically connected to motor 18 so that the setting of the potentiometer 20 is varied in accordance with movement of motor 18 as is the setting of the tuning core. As a consequence, the output voltage of position potentiometer 20 is indicative of the position of the tuning core and is accordingly related to the impedance of the loading coil in antenna tuner 4.

Still referring to FIG. 1, frequency counter 6 is coupled to radio frequency transmission line 2 which carries the radio transmitter signals of radio transmitter 1. Frequency counter 6 is adapted to produce a digital output signal which is representative of the frequency of the signal applied thereto, that is the output signals of radio transmitter 1. The output terminals of frequency counter 6 are coupled to storage register 11. The storage register 11 retains and stores the frequency counter signal from frequency counter 6 while at the same time applying it to digital to analog converter 15. The latter device produces an analog signal which is representative of the frequency of the output signal of radio transmitter 1. The output of digital to analog converter 15 is coupled to a first set of input terminals 25 on comparator 12.

The output of position potentiometer 20 is connected to a second set of input terminals 26 on comparator 12. The output terminal 27 of comparator 12 is coupled to motor control 19 and the output terminal of the motor control 19 is connected to and provides the motor control signal for, the antenna tuner motor 18.

Also included in the apparatus but not illustrated in the drawings, is a device within the transmitter by means of which the transmitter emits a short sample of the radio transmitter signal for analysis by the frequency counter. This signal is emitted upon commencement of operation of the transmitter or upon the operator making a major change in transmission frequency. With most transmitters, existing equipment may be used for this purpose. With single side band equipment, the sample signal may be provided by injecting a tone in the microphone input circuit when the transmitter is keyed.

In operation, the radio transmitter signal from radio transmitter 1 is applied via line 2, to the input terminals of frequency counter 6. The frequency counter 6 in response to the applied radio transmitter signal produces at the output terminal thereof, a digital signal representative (within the tolerance of the frequency counter) of the frequency of the applied signal. This frequency counter signal from frequency counter 6 is applied to storage register 11 which stores the signal while at the same time transmitting it to digital to analog converter 15. The digital to analog converter 15 produces at its output terminals a voltage which is the analog of the applied digital signal. This voltage analog of the radio transmitter frequency is applied to a first set of input terminals 25 of comparator 12.

As explained previously, the output voltage signal of position potentiometer 20 is related to the impedance of the loading coil of antenna tuner 4 and it is therefore a function of the impedance of the antenna circuit. The antenna tuner position (analog) signal of position potentiometer 20 is applied to a second set of input terminals 26 of comparator 12. The comparator 12 produces a coarse position control signal at its output terminal 27 as long as there is a difference in the voltages applied to its input terminals 25 and 26. The output signals of the digital to analog converter 15 and the position potentiometer 20 are so related that for any value of frequency, the voltage representative of such frequency which is applied to terminal 25 is equal to the voltage applied to terminal 26, when the antenna circuit is in resonance at that frequency. When the voltages applied to terminals 25 and 26 are unequal (i.e. during off resonance) a coarse positon control signal occurs at terminal 27. This coarse position control signal is applied to motor control 19 which in turn provides a motor control signal proportional thereto and of a corresponding polarity, to motor 18. The polarity of the coarse position control signal produced by comparator 12 is of course dependent on the relative polarities of the voltages applied to the input terminals 25 and 26 thereof. Motor 18 and the connected position potentiometer 20 are thus caused to rotate by the motor control signal in such a direction as to bring the voltage applied to the second set of input terminals 26 (the output of position potentiometer 20) to the level of the voltage at the first set of input terminals 25 (the output of digital to analog converter 15) of comparator 12. Thus when motor 18 has moved position potentiometer 20 to a position wherein its antenna tuner position signal applied to comparator 12 is equal to the output voltage signal of digital to analog converter 15 the desired rough relationship between transmitter frequency and antenna impedance, exists and coarse tuning of the antenna circuit is complete. The system is then ready to commence the fine tuning operation.

During the fine tuning operation the coarse tuning apparatus described above does not operate since the degree of mismatch being corrected is outside the range of discrimination of the frequency counter. In the fine tuning operation, the radio transmitter signal is applied to the phase dectector 7 which measures the phase angle of the transmitter signal. On the assumption that the transmitter is non-reactive, the phase angle of the transmitter output signal which is measured by the phase detector 7, is caused by reactance of the antenna circuit. The phase detector 7 produces a fine tune control signal which is proportional to the phase angle of the radio frequency signal in the antenna circuit. This fine tune control signal is applied to the motor control 19 which provides motor 18 with a correlated motor control signal for controlling the operation of the motor 18.

As the rotation of the motor 18 varies the impedance of the tuner coil in the antenna circuit, the system will approach resonance. At the point of resonance the phase angle of the radio frequency signal is zero which causes the phase detector 7 to produce zero fine tune control signal. This condition causes motor 18 to cease rotation and fine tuning is complete.

As will be apparent from the foregoing, the frequency counter is utilized only in conjunction with the coarse tuning of the antenna circuit. Therefore the frequency counter is not required to measure the transmitter frequency with a high degree of accuracy thus making it possible to use a frequency counter of relatively low tolerance. For example, it is sufficient for the frequency counter to provide an output with a resolution of approximately 1 to 10 k Hz of the radio frequency being measured. Tuning to a greater resolution than the accuracy of the frequency counter is provided by the fine turning equipment.

It will also be appreciated that coarse tuning does not take place during the fine tuning operation because the fine tuning is carried out in a frequency range within which the frequency counter is incapable of discrimination. Nevertheless both the fine tuning and coarse tuning equipment remain in operative condition throughout transmission for the purpose of detecting and correcting mismatches.

Thus if, during operation of the transmitter, a slight variation in a parameter occurs, such as a change in the impedance of the antenna circuit or the frequency of transmission, the phase detector 7 senses the resulting slight mismatch and alters the reactance of the antenna circuit to bring the antenna circuit back into resonance. If a major change in a parameter occurs during operation such as the deliberate switching of transmission frequency, the resulting gross mismatch is sensed by the frequency counter and a correcting signal is supplied to the motor 18 in the antenna tuner 4. The adjustment of the antenna tuner 4 by the signal from the frequency counter 6 produces coarse tuning of the antenna circuit. When such coarse tuning is complete the antenna is then fine tuned by operation of the phase sensor and antenna turner in the manner described previously.

Figure 2:
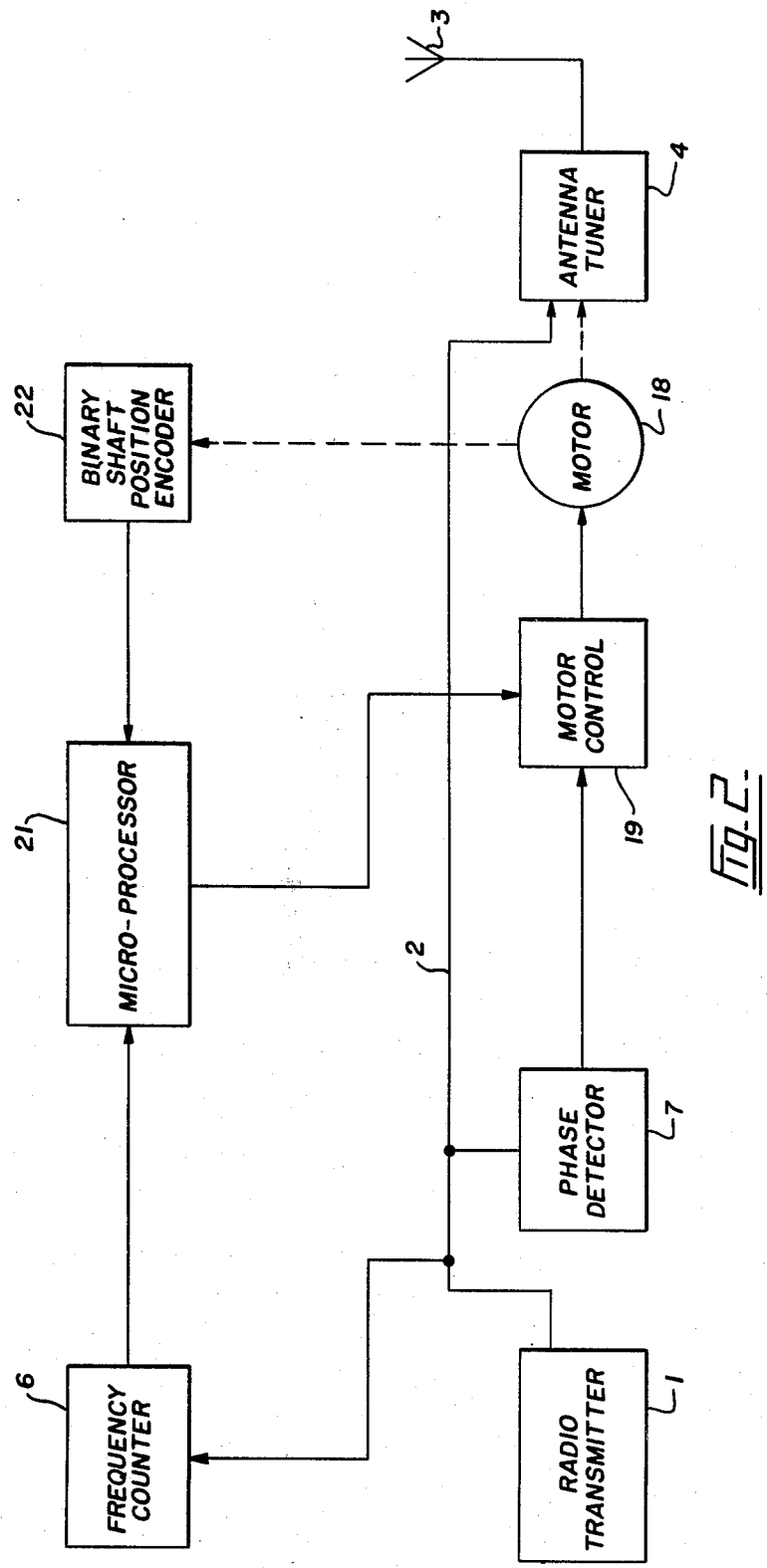
FIG. 2 is a block diagram illustrating an automatic tuning apparatus similar to that shown in FIG. 1 and including a microprocessor as part of the coarse tuning apparatus.

Referring now to FIG. 2, there is shown as antenna tuning device wherein coarse tuning is accomplished by means of a digital system. The coarse tuning apparatus according to this embodiment, includes frequency counter 6 and microprocessor 21. The frequency counter 6 is connected to the output of radio transmitter 1 and supplies microprocessor 21 with a digital signal representative of the frequency of the radio transmitter signal.

As shown in FIG. 2, the antenna circuit includes an antenna tuner 4 similar to the antenna tuner described previously. The antenna tuner includes a variable reactance physically connected to and its position set by, motor 18. Also connected to and controlled by motor 18 is binary shaft position encoder 22 which provides an output signal representative of the setting of the variable reactance in antenna tuner 4. The antenna tuner position signal (binary) produced by the binary shaft position encoder 22 is applied to a second set of input terminals of microprocessor 21. Since the setting of the variable reactance of the antenna tuner 4 is not linearly proportional to the value of its reactance, the microprocessor 21 is adapted to compensate for this nonlinearity and to produce an output signal which is representative of the reactance of the variable reactance in the antenna tuner. A comparison of the digital signal representative of the transmitter frequency and the signal representative of the reactance of the variable reactance in antenna tuner 4, provides a determination of whether the reactance of the tuner is of the correct valve for resonance, at the particular radio frequency being used. This comparison is carried out in the present apparatus by the microprocessor 21. When a mismatch between these signals is sensed, the microprocessor 21 provides a coarse position control signal to the motor control 19. The polarity of this signal is such as to alter the reactance of the antenna tuner in a direction to reduce the mismatch between the transmitter signal and the impedance of the antenna circuit. When the antenna circuit reaches resonance, the relationship between the two imput signals to the microprocessor 21 is such that the microprocessor 21 ceases further output to the motor control 19 and rough tuning is complete.

Fine tuning of the apparatus shown in FIG. 2 accomplished by use of the phase detector 7 and the motor control 19 in the same way as described in connection with FIG. 1.

Figure 3:
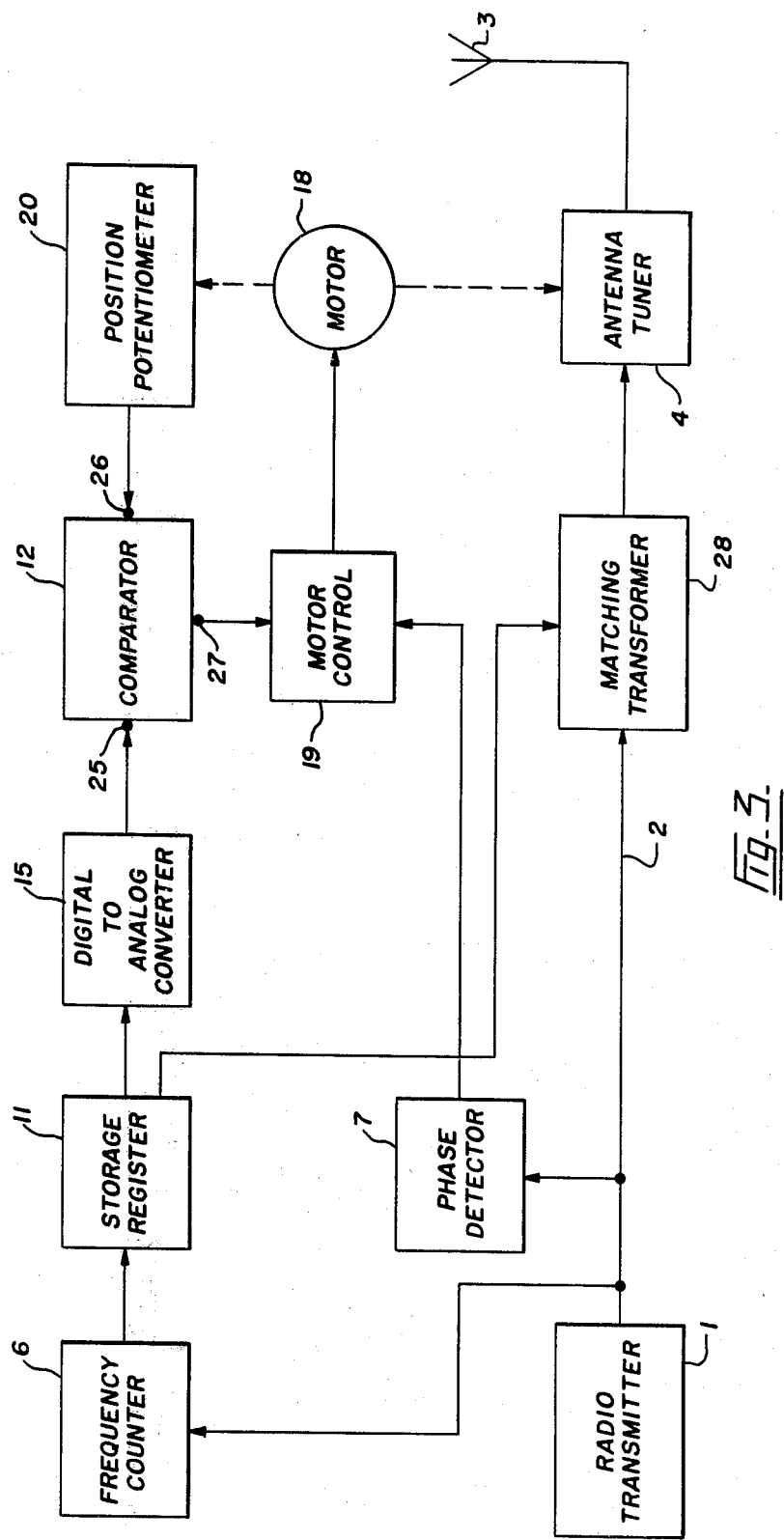
FIG. 3 is a block diagram illustrating an automatic tuning apparatus similar to that shown in FIG. 1 including a matching transformer.

FIG. 3 shows a further embodiment of the invention wherein a matching transformer is included in the antenna circuit for the purpose of further assisting in matching the impedance of the antenna circuit to the transmitter and transmission line. An output signal from storage register 11 controls the setting of the variable matching transformer 28. The variable matching transformer 28 provides the degree of impedance matching in accordance with the frequency of the transmitter signal. The coarse and fine tuning circuits of the apparatus described in FIG. 3 otherwise operate the same as previously described in relation to FIG. 1.

The embodiments of the invention in which an exclusive property or privilege is claimed are defined as follows:

1. Apparatus for automatically tuning an antenna circuit for an antenna to any transmitter signal of a radio transmitter coupled to said circuit, comprising a tuner for the antenna, a motor for operating the tuner, a controller for the motor, apparatus coupled to the tuner to produce an antenna tuner position signal in accordance with the impedance of the antenna circuit, a frequency counter coupled to the circuit and adapted to produce a frequency counter signal representative of the frequency of each transmitter signal and comparing apparatus coupled to the frequency counter and to the tuner position signal apparatus and to the motor controller for comparing the frequency counter signal and the antenna tuner position signal, said comparing apparatus being adapted, when there is a significant difference between the signals being compared, to apply a coarse position control signal to the motor controller to tune the antenna circuit until there is no significant difference between the compared signals.

2. Apparatus as claimed in claim 1 comprising a phase detector coupled to the circuit for applying a fine tune control signal for said each transmitter signal to the motor controller to tune the antenna circuit until the circuit comes into resonance.

3. Apparatus in accordance with claim 1 including a matching transformer coupled to said antenna tuner adapted to further vary the impedance of said antenna circuit, the operation of said matching transformer being controlled by said frequency counter signal.

* * * * *